(12) United States Patent
Becker et al.

(10) Patent No.: US 9,449,717 B2
(45) Date of Patent: Sep. 20, 2016

(54) MEMORY BUILT-IN SELF-TEST FOR A DATA PROCESSING APPARATUS

(71) Applicant: ARM LIMITED, Cambridge (GB)

(72) Inventors: Alan Jeremy Becker, Cambridge (GB); Chiloda Ashan Senerath Pathirane, Cambridge (GB); Robert Campbell Aitken, San Jose, CA (US)

(73) Assignee: ARM Limited, Cambridge (GB)

( * ) Notice: Subject to any disclaimer, the term of this patent is extended or adjusted under 35 U.S.C. 154(b) by 144 days.

(21) Appl. No.: 14/310,162

(22) Filed: Jun. 20, 2014

(65) Prior Publication Data

US 2015/0371718 A1 Dec. 24, 2015

(51) Int. Cl.
| | | |
|---|---|---|
| G11C 29/00 | (2006.01) | |
| G11C 29/14 | (2006.01) | |
| G06F 11/00 | (2006.01) | |
| G11C 29/16 | (2006.01) | |
| G11C 29/04 | (2006.01) | |

(52) U.S. Cl.
CPC ............ *G11C 29/14* (2013.01); *G06F 11/008* (2013.01); *G11C 29/16* (2013.01); *G11C 2029/0409* (2013.01)

(58) Field of Classification Search
CPC ... G11C 5/04; G11C 29/56008; G11C 29/76; G11C 29/08; G11C 29/40; G11C 2029/0409; G11C 29/14; G11C 29/18; G11C 2029/1802; G11C 2029/1806; G11C 29/22; G11C 29/30; G06F 11/27
See application file for complete search history.

(56) References Cited

U.S. PATENT DOCUMENTS

| | | | | | |
|---|---|---|---|---|---|
| 5,105,425 | A | * | 4/1992 | Brewer | G11C 29/88 365/200 |
| 5,423,029 | A | * | 6/1995 | Schieve | G06F 11/2221 714/42 |
| 7,203,873 | B1 | * | 4/2007 | Adams | G11C 29/1201 714/31 |
| 7,293,199 | B1 | * | 11/2007 | Zarrineh | G11C 29/16 714/30 |
| 7,304,875 | B1 | * | 12/2007 | Lien | G06F 11/1064 365/200 |
| 8,006,144 | B2 | | 8/2011 | Hughes | |

(Continued)

OTHER PUBLICATIONS

A. Cheng, "Comprehensive Study on Designing Memory BIST: Algorithms, Implementations and Trade-offs", Digital System Testing Project Report, EECS 579, Fall 2002, Advanced Computer Architecture Lab, Department of Electrical Engineering and Computer Science, The University of Michigan, Dec. 16, 2002, 34 pages.

(Continued)

*Primary Examiner* — Guerrier Merant
(74) *Attorney, Agent, or Firm* — Nixon & Vanderhye P.C.

(57) ABSTRACT

A data processing apparatus has at least one memory and processing circuitry. A memory built-in self-test (MBIST) interface receives a MBIST request indicating that a test procedure is to be performed for testing at least one target memory location. Control circuitry detects the MBIST request and reserves for testing at least one reserved memory location including the target memory location. During the test procedure, the memory continues servicing memory transactions issued by the processing circuitry that target a memory location other than the reserved location reserved by the control circuitry. The processing circuitry is stalled if it attempts to access a reserved memory location. Testing consists of short bursts of transactions which occur infrequently. In this way, MBIST testing may continue while the processor is operation in the field with reduced performance impact.

17 Claims, 2 Drawing Sheets

(56) References Cited

U.S. PATENT DOCUMENTS

| | | | |
|---|---|---|---|
| 8,423,841 B1* | 4/2013 | Lee | G11C 29/12015 365/201 |
| 2003/0051197 A1 | 3/2003 | Evans | |
| 2005/0028058 A1 | 2/2005 | Perner | |
| 2005/0120284 A1* | 6/2005 | Ouellette | G11C 29/1201 714/718 |
| 2005/0283566 A1* | 12/2005 | Callaghan | G06F 12/1408 711/104 |
| 2008/0293363 A1* | 11/2008 | Olgaard | H04B 17/29 455/67.7 |
| 2010/0235691 A1 | 9/2010 | Chen | |
| 2012/0324301 A1 | 12/2012 | Ferraro | |
| 2013/0173970 A1* | 7/2013 | Kleveland | G11C 29/44 714/710 |

OTHER PUBLICATIONS

S. Boutobza et al., "A Transparent based Programmable Memory BIST", Proceedings of the Eleventh IEEE European Test Symposium, (ETS'06), 2006, 6 pages.

* cited by examiner

MEMORY BUILT-IN SELF-TEST FOR A DATA PROCESSING APPARATUS

BACKGROUND

1. Technical Field

The present technique relates to the field of data processing. More particularly, it relates to a technique for performing memory built-in self-test (MBIST).

2. Technical Background

It is known to provide data processing systems with a self-testing mechanism for testing a memory provided within the apparatus, so that when the memory circuits have been fabricated then the apparatus may conduct a self-test or a series of self-tests to determine whether there are any defects present that mean the circuit should be rejected. Such a technique is typically referred to as a memory built-in self-test (MBIST). As well as performing MBIST at the time of fabrication of the data processing apparatus, MBIST can also be performed later on when the integrated circuit is deployed in the field and is performing its designed function (which may be referred to as "online" MBIST, "live" MBIST or "in-field" MBIST). However, existing online MBIST techniques severely impact the regular functioning of the processing circuitry. The present technique seeks to address this problem.

SUMMARY

Viewed from one aspect, the present technique provides a data processing apparatus comprising at least one memory configured to store data;

processing circuitry configured to issue memory transactions for accessing data in the at least one memory;

a memory built-in self-test (MBIST) interface configured to receive a MBIST request indicating that a test procedure is to be performed for testing at least one target memory location of the at least one memory; and control circuitry configured to detect the MBIST request received by the MBIST interface, and in response to detecting the MBIST request, to reserve for testing at least one reserved memory location including said at least one target memory location;

wherein during the test procedure, the at least one memory is configured to continue servicing memory transactions issued by the processing circuitry which target a memory location other than the at least one reserved memory location reserved by the control circuitry.

Existing online memory test techniques either use software running on the processor to test a memory directly or software disables processor access to the memory to be tested so that an external device can carry out a test via a test interface. Typically software stops its normal operation and goes into a test mode. This is extremely invasive and prevents the processor carrying out its normal functionality. To address this problem, control circuitry is provided for detecting an MBIST request received at an MBIST interface, which indicates that a test procedure is about to be performed on at least one target memory location within at least one memory. On detecting the MBIST request, control circuitry provided reserves for testing at least one reserve memory location which includes at least the target memory location to be tested. When the test procedure is then performed, the at least one memory can continue to service memory transactions issued by the processing circuitry which target memory locations other than the reserved locations reserved by the control circuitry. Hence, only a portion of the at least one memory is reserved and other portions can still service transactions from the processing circuitry, so that the processor may continue to function as normal and the testing may be transparent to the software executing on the processor. The provision of dedicated control circuitry in hardware for reserving the memory for testing (which may for example cause the processor to be stalled if it accesses a reserved memory location) eliminates the need for interrupting processing of the processing circuitry to perform MBIST. This results in much lower impact on performance caused by the MBIST procedure and hence makes it possible for the MBIST to coexist with the regular functions of the circuitry. This is particularly important for data processing apparatuses which perform safety-critical functions for example, in which it would be undesirable to disable the regular processing of the processing circuitry for a long time.

The control circuitry for detecting the MBIST request and reserving locations in the memory for testing may in some cases be provided within MBIST interface control circuitry coupled to the MBIST interface for controlling the response of the data processing apparatus to transactions received over the interface. In other cases, the control circuitry may be provided within memory control circuitry for controlling one or more of the at least one memory. For example the memory controller for a given memory may handle all transactions passing through to that memory and also handle reservation of memory locations for testing and arbitration between test transactions and regular memory transactions. This approach is good because the functional logic for controlling the servicing of memory transactions can be reused, and this approach has better timing, tests the memory controller functional logic, reduces area, power and routing, and is easier to implement. However, in some cases the control circuitry may correspond to part of both the MBIST interface control circuitry and the memory control circuitry, with for example the MBIST interface control circuitry detecting the MBIST request and then triggering the memory control circuitry to reserve an areas of memory for testing. Also, it would be possible to implement the control circuitry by adding logic to a typical RAM macro to reserve memory locations for MBIST and arbitrate between memory transactions and MBIST test transactions, but this may require adding a wait signal to a RAM's functional interface to stall the processor when it tries to access a reserved location.

In general, memory locations may be reserved for testing in any way which prevents the processing circuitry accessing the reserved memory locations while the test procedure is being carried out. For example, memory transactions from the processing circuitry which target a reserved memory location may be stalled or otherwise prevented from being serviced. Meanwhile, memory transactions issued by the processing circuitry which target areas of memory other than the reserved area can be serviced as normal by the memory. As the processor may stall for a variety of reasons (e.g. due to hazards or an access to a slow external memory, or because a required data value is not present in an L1 cache and so has to be fetched from L2 memory), stalling for a small number of clock cycles because of testing would not be unusual, and so would not significantly affect the overall performance.

In some cases the control circuitry may prevent servicing of certain memory transactions simply by setting control flags which disable access to entire memory units or particular blocks of memory locations. In other cases the control circuitry may maintain a lock record identifying which locations are reserved or not. An arbitration unit within the memory control circuitry may then stall memory transactions from the processor which target the reserved memory locations.

Memory locations may be reserved for testing at different granularities. In systems having multiple memory types, such two or more of a data cache, instruction cache, data tightly coupled memory (DTCM) or instruction tightly coupled memory (ITCM) for example, may be provided. In this case, an entire memory type may be reserved for testing if one or more locations within that memory are being tested, while the processor can continue to use other types of memories. This approach may be efficient to implement in practice. Since a particular processor may be designed for systems which may or may not have a given type of memory (e.g. a DTCM may not always be provided), the apparatus may already have some control logic which can disable/enable a particular memory type, which can then be reused for reserving the memory for testing when a MBIST request is received.

On the other hand, memory locations could also be reserved at a more fine-grained level. For example, a given memory type may include several logical memories (e.g. an instruction cache may contain four logical memories, e.g. comprising 2 tag memories and 2 data memories). Each logical memory may then be made of several physical memory units, and each physical memory unit may then be divided into a number of banks or other sub-divisions of memory locations. Hence, it is possible to reserve for testing a given memory type, logical memory, physical memory unit, bank, row or other sub-division of memory locations that includes the target locations being tested. Also, it is possible to reserve individual locations for testing, rather than a larger block of memory locations. The control circuitry may maintain lock information indicating which memory locations or groups of memory locations are locked for testing, so that memory transactions to these locations can be prevented from being serviced.

The reservation of memory locations for testing may take place automatically in hardware without software intervention or interruption of the processing circuitry. While the MBIST request itself may be triggered by software executed by the processing circuitry, the response to the MBIST request may be provided in hardware by the control circuitry, so that the testing is entirely transparent to the software executing on the processing circuitry.

Following completion of the test procedure, the control circuitry may unreserve the reserved memory locations so that they become available again for servicing memory transactions issued by the processing circuitry. In some cases, it may not be necessary for the test procedure to finish completely before the reserved memory locations can be unreserved. For example, if the last part of the test procedure does not change the data in the tested memory locations, and the test procedure has already restored the original data in these locations by this point, then the reserved locations may be unreserved before the end of the test procedure so that the memory can resume servicing memory transactions from the processing circuitry earlier, to reduce the performance impact of MBIST.

Existing MBIST test procedures tend to test all the locations within a memory in a single test run. However, this may require a long time to complete, especially as the test procedure often cycles through every location of the memory several times to perform various checks. This is because most MBIST test procedures are typically designed for production testing when the entire memory space needs to be checked for faults to determine whether the integrated circuit is usable. However, when performing online MBIST, such MBIST test procedures would cause a severe performance impact. Therefore, existing online MBIST is normally only carried out at power-on or power-off when the processor will not be fully operational anyway.

The inventors of the present technique realised that for online MBIST, the test procedure does not need to be as thorough as production MBIST, since production MBIST will already have been carried out during manufacture, and so rather than probing the entire memory in a short space of time, it is possible to spread out testing over a long period of time since it is relatively unlikely that any one location would be faulty. This can be exploited to ensure that the performance impact of the test procedure as low, so that online MBIST can be performed concurrently with the regular operation of the processing circuitry with little performance impact.

Hence, for online MBIST, testing may be split into relatively short bursts of test transactions, and each burst may only test a subset of the memory locations. For example, each burst of transactions may only test one, two, or other relatively small number of memory locations. The shorter the bursts, the lower the impact on the processing performance. If further locations need to be tested, then multiple burst may be carried out for different subsets of locations, spread over a period of time. Over time, by performing many bursts, the entire memory can be tested. The time between successive bursts may be much longer than the time taken to perform the test procedure for a single burst (e.g. bursts could be issued relatively infrequently, such as every 10,000 clock cycles for example, but a test procedure for a single burst may only take 20 clock cycles or fewer). Each short test burst can occur on a regular basis, for example triggered by a counter. When the counter expires it may cause the MBIST controller to carry out the short test burst, issuing a MBIST request to trigger the control circuitry to configure the data processing apparatus to be ready for testing. In this way, the performance impact is minimal. Also, the interrupt latency if an interrupt is received by the processor during one of these test procedures is very low since it will not take long to complete the rest of the burst.

Each burst does not have to occur at a precise interval with respect to the previous burst. It is possible to provide the ability to postpone or not perform a burst if it occurs when critical software is about to be executed or is currently being executed. Bursts could also be coordinated with software so that they are occur at a time that software is likely to be idle or performing non-critical tasks, for example at the end of a processing loop.

It is possible to provide the ability to interrupt a burst of the test procedure part way through. For example, if the processor needs to service a critical interrupt the burst could be shortened by missing out certain checking steps which could be performed later in a new burst if necessary, depending on when the interrupt occurs. However, as the bursts may be very short, interrupting the burst may not save many clock cycles and would require a more complex controller to achieve. Therefore, it may be more efficient to make each burst of the test procedure non-interruptible so that once it starts, it cannot be interrupted until the point at which the tested locations have been restored to the state they were in when the burst started.

The MBIST request may be received over the MBIST interface from an MBIST controller, which may be located off-chip. Alternatively, an on-chip source may generate the MBIST request or the MBIST controller functionality could be within the processor.

When the control circuitry detects the MBIST request, it may issue an MBIST acknowledge signal over the MBIST signal face to trigger an MBIST controller to start the test procedure. The control circuitry may delay issuing the acknowledgement signal until the apparatus is in a state ready for performing the test procedure. For example, if the processor is currently executing a critical action which should not be interrupted, then the control circuitry may delay the acknowledgement. Also, the acknowledgment signal may be delayed until at least one in-flight memory transaction issued by the processing circuitry is completed. For example, a memory transaction may have encountered a cache miss and this may have triggered a linefill from an external memory or from a further cache. This is also useful because the functional logic in a memory controller, for example control logic and pipeline registers, may also be used by the MBIST transactions. Also, it may be undesirable to stall an in-flight transaction because it may consist of several sub-transactions that prevent other processors from accessing an external memory or cache, or other unrelated transactions may be blocked in a system.

As part of the test procedure, the MBIST interface may receive at least one test transaction from the MBIST controller for testing the at least one target memory location. Some systems may have a dedicated MBIST transaction path for routing the transactions from the interface to the memory, which may be entirely separate from the path used for normal memory transactions from the processing circuitry. In this case, each memory may have a multiplexer which selects between test transactions received over the interface and regular memory transactions received from the processor. However, this approach may result in duplication of circuitry, adversely affect functional timing and providing multiplexers at the memory may make it harder to allow the regular memory transactions to continue to be serviced while parts of the memory are being tested.

Therefore, it is useful to reuse part of the memory control circuitry used by the processing circuitry to route memory transactions to the memory so that it also conveys the test transactions from the MBIST interface. For example, each memory may have a corresponding memory controller. The memory controller may have an MBIST interface unit for receiving the test transactions (including control information, addresses and data values, for example) and routing them to memory, in addition to its normal interface with a load/store unit of the processing circuitry for handling regular memory transactions. By reusing the memory control circuitry for controlling servicing of the test transactions, test transactions can be serviced "at speed" with similar latencies to regular memory transactions. As MBIST test transactions can be passed through pipeline registers in the memory interface and control logic can be reused, this results in little or no impact on memory timing and reduces circuit area and power consumption, and also improves test coverage because faults in the memory interface logic are detectable.

Although non-transparent MBIST test procedures may be used, it is particularly useful for the test procedure to be transparent, which means that data values in the tested memory locations at the end of the test procedure are the same as the data values at the start of the test procedure (provided no memory fault is detected). Hence, the transparent test procedure may carry out a number of operations on the target memory location, but by the end of the procedure it will restore the original data value to the memory. This will avoid the need for the processor to perform state saving/restoring operations in software, which would increase the impact on the regular processing of the processor.

As mentioned above, the test procedure may be performed in short bursts which tests relatively few memory locations at a time. More particularly, the test procedure may test a pair of the memory locations which are located in different parts of the memory (e.g. in different banks, columns or rows of the memory). For example, the pair of memory locations may be two locations whose memory addresses are separated by a given constant. Testing a pair of locations at a time can be useful for stressing the memory and its associated control logic more thoroughly, to give a stronger test. This is because reading or writing values first from one location of the pair and then from the other may cause different control signals (e.g. word lines or bank selectors) to be asserted or cleared or different circuits within the memory to be used (e.g. bitline conditioning and sense amplifiers), which may more accurately reflect the delays associated with real accesses to memory in which an access to one part of the memory may be followed by an access to another part of the memory. It is also desirable to perform particular memory transactions back to back, at full functional speed. This stresses the memory further by switching the memory control signals and circuits at or close to the maximum functional speed.

More particularly, each burst of the test procedure may comprise:
(a) reading first and second data values from the pair of memory locations and saving the first and second data values to first and second storage locations;
(b) writing selected data values to the pair of memory locations;
(c) checking whether data values read from the pair of memory locations match the selected data values written to the pair of memory locations;
(d) writing the first and second data values from the first and second storage locations to the pair of memory locations; and
(e) checking whether data values read from the pair of memory locations match the first and second data values stored in the first and second storage locations.

Hence, this test algorithm may read the existing values from the pair of locations and save them to predetermined locations (such as registers) to make sure that these values can be restored at the end of the test. Some selected data values are written to the pair of memory locations and then read back to check whether they are still the same as the written values. The selected data values may be the same or different for the pair of locations, and may be based on one of the first and second data values, or instead could be a completely independent value. The original first and second data values are then restored to memory locations and then read back to check whether they are correct. If all the checks pass then the pair of locations may be determined to be error-free, while if one of the checks finds that one of the values does not match its expected value, then an error may be signalled.

The registers used to store the data values and associated data checking logic may be part of the MBIST controller or within the processor, closer to the memory, for example in each memory controller. If this datapath logic is placed inside the processor the MBIST controller would only provide address and control information for each memory transaction and would not receive or transmit data values.

The advantage of placing this datapath logic closer to the memory is that the latency between issuing a read address at the MBIST interface and receiving the read data back to the data register can be reduced. This could then save a few clock cycles between parts (a) and (b) in the example test procedure above at the expense of additional area.

When the second write to the pair of memory locations is complete (part (d) above), the reserved area of memory can be unreserved since the subsequent read at part (e) to check whether the values are correct will not affect the values in memory and so the processor can start issuing memory transactions to these regions again. If an error is subsequently detected at part (e), then an error recovery process can be initiated which may prevent the processing circuitry processing results of any transactions which have already been issued to the faulty memory locations before the check was complete.

Viewed from another aspect, the present technique provides a data processing apparatus comprising:

at least one memory means for storing data;

processing means for issuing memory transactions for accessing data in the at least one memory means;

memory built-in self-test (MBIST) interface means for receiving a MBIST request indicating that a test procedure is to be performed for testing at least one target memory location of the at least one memory means; and control means for detecting the MBIST request received by the MBIST interface, and in response to detecting the MBIST request, reserving for testing at least one reserved memory location including said at least one target memory location;

wherein during the test procedure, the at least one memory means is configured to continue servicing memory transactions issued by the processing means which target a memory location other than the at least one reserved memory location reserved by the control means.

Viewed from a further aspect, the present technique provides a memory built-in self-test (MBIST) method for a data processing apparatus comprising at least one memory and processing circuitry configured to issue memory transactions for accessing data in the at least one memory;

the method comprising:

detecting a memory built-in self-test (MBIST) request received by a MBIST interface of the data processing apparatus, the MBIST request indicating that a test procedure is to be performed for testing at least one target memory location of the at least one memory;

in response to detecting the MBIST request, reserving for testing at least one reserved memory location including the at least one target memory location; and during the test procedure, the at least one memory servicing memory transactions issued by the processing circuitry which target a memory location other than the at least one reserved memory location;

wherein the data processing apparatus comprises control circuitry which detects the MBIST request and reserves the at least one reserved memory location in response to detecting the MBIST request.

Further aspects, features and advantages of the present technique will be apparent from the following description of examples, which is to be read in conjunction with the accompanying drawings.

DESCRIPTION OF EXAMPLES

Figure 1:
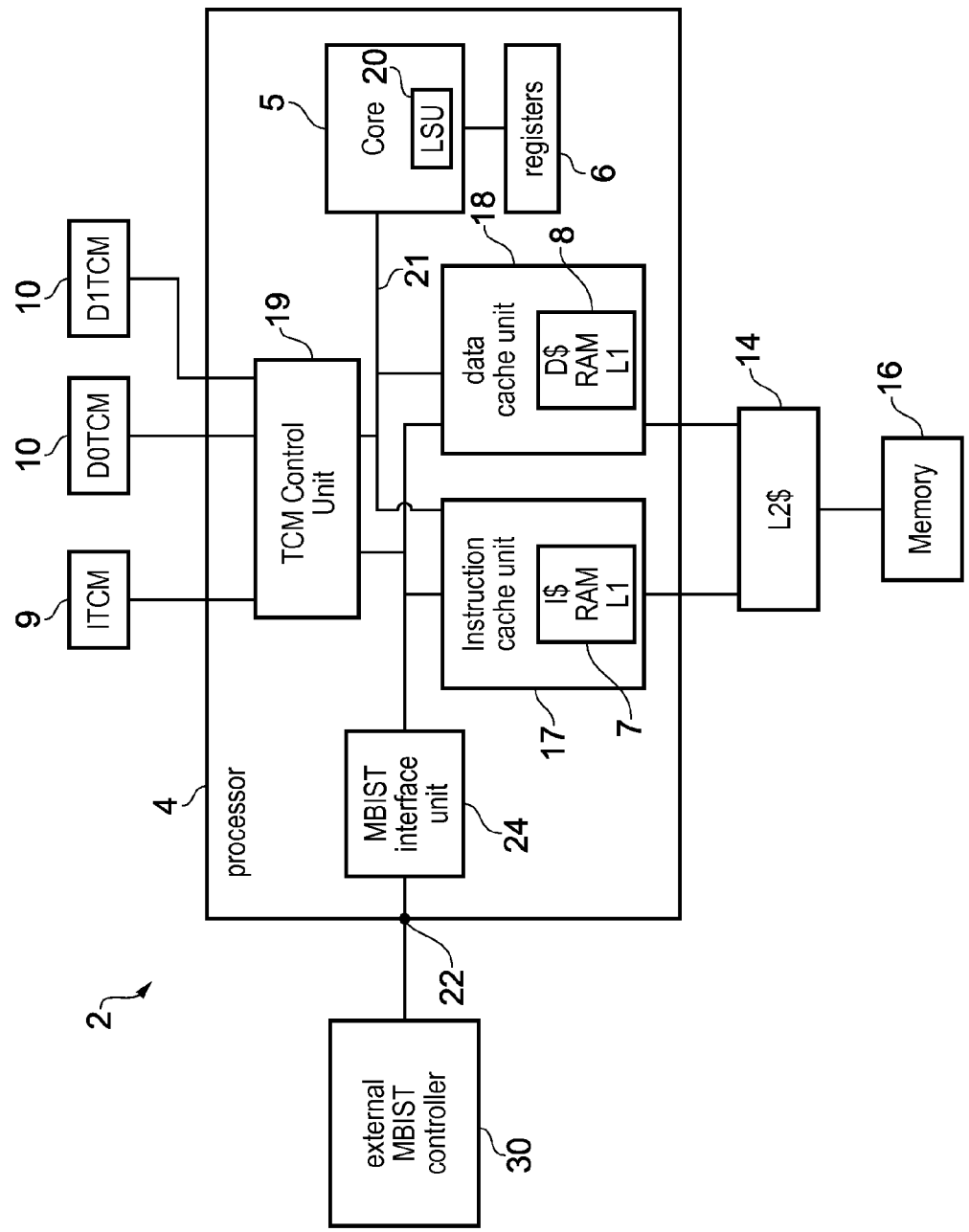
FIG. 1 schematically illustrates an example of a data processing apparatus with memory built-in self-test capability.

FIG. 1 schematically illustrates an example of a data processing apparatus (integrated circuit or chip) 2 comprising a processing circuit 4, which may be a CPU, GPU or a memory controller such an L2 cache controller, for example. The processing circuit 4 has a processor core 5 for performing data processing. The core 5 has a set of registers 6 for storing data values to be processed.

One or more types of memory are provided, some of which may be on-chip and others may be off-chip. In this example the memories include an instruction cache 7 for storing instructions to be processed, a data cache 8 for storing data values accessed by the processor 4, an instruction tightly coupled memory (ITCM) 9 and one or more data tightly coupled memories (DTCM) 10. When an instruction or data value required by the processor core 5 is not available in the level 1 (L1) instruction cache 7 or L1 data cache 8, then it is fetched from a level 2 (L2) cache 14 or from main memory 16 if not present in the L2 cache. In this example, the L2 cache 14 is shared between the instruction L1 cache 7 and data L1 cache 8, but it will be appreciated that separate L2 caches for instructions and data could also be provided. The ITCM 9 and DTCM 10 are memories which are local to the processor (and so have lower access latency compared to the L2 cache 14 and main memory 16), but which have greater predictability than the instruction cache 7 and data cache 8, because there are no linefill operations and evictions. Instructions or data stored to the ITCM 9 or DTCM 10 will remain in the tightly coupled memory until it is removed by the processor core 5. For example, critical pieces of code or data which should always be available at low latency may be placed in the ITCM 9 or DTCM 10. It will be appreciated that some embodiments may not have all the types of memory 7, 8, 9, 10 shown in FIG. 1 (e.g. some systems may not have any TCMs or may have a shared instruction/data cache).

Each memory type 7, 8, 9, 10 has a corresponding memory controller 17, 18, 19. For example, an instruction cache unit 17 controls the instruction cache 7, a data cache unit 18 controls the data cache 8 and a TCM control unit 19 controls the TCMs 9, 10. Each memory controller may receive memory transactions issued by a load/store unit 20 of the processing core 5, via a bus 21. A transaction may be the result of a load or store instruction or an instruction fetch. The bus 21 may carry multiple memory transactions at once, up to one per memory 7-10. Each memory type 7, 8, 9, 10 may include several logical memories (e.g. a cache 7, 8 may include one or more tag RAM units and one or more several data RAM units). Each logical memory may include several physical banks of memory.

The chip 2 containing the processor 4 has an in-built self-testing capability (referred to herein as memory built-in self-test or MBIST) which can be used to test whether memory locations are faulty. The MBIST logic may be used to provide online MBIST in which the memories 7-10 can be tested for faults when the chip 2 has already been deployed in the field, and the processor core 5 remains operational. This is useful because even if the memory has been fully tested and is determined to be error-free at manufacture, faults may arise later on for various reasons. For example, individual memory cells may fail due to aging transistors, wordline timing faults may arise due to electro-migration, vias or contacts may wear out due to electro-migration or sense amplifiers may fail as their transistors age. Typically these aging effects cause the performance of the memory circuits to degrade which slows the them down. Therefore it is useful to perform memory test transactions at full functional speed, back to back. Faults in memory locations can lead to processing errors if an incorrect value is read from memory or a key piece of data or required instruction cannot be read at all. This is particularly important for devices used for safety-critical applications (e.g. the device which controls anti-lock braking systems in a car). By providing online MBIST capability, such errors can be detected before they cause a safety risk.

To support online MBIST, the processor 4 has an MBIST interface 22 (e.g. a set of input/output pins) and an MBIST interface unit 24 for configuring the processor 4 during the MBIST procedure. The data processing apparatus 2 also includes an MBIST controller 30 for controlling performance of the MBIST test procedure. In other embodiments the MBIST controller could be located within the processor 4.

The MBIST interface 24 allows control, address and data information to be transferred between the MBIST controller 30 and the processor 4. This interface 24 has a standardized protocol that includes (a) an MBIST entry phase (b) MBIST read and write transactions that are used to test the target memory and (c) an MBIST exit phase. The MBIST entry phase uses request and acknowledge signals and array bus that are part of the interface 24 to select a logical memory to be tested. The memory transactions (b) occur between the MBIST entry and exit phase (a) and (c). MBIST exit phase uses request, acknowledge and array select signals that are part of the interface 24 to deselect the logical memory selected in the entry sequence (a). The array signal does not change during all phases of the protocol (a), (b) and (c). This interface 24 runs at the same clock frequency as the processor 4 and is able to carry back to back MBIST transactions.

The MBIST controller 30 controls the MBIST interface 24. It contains the functionality for autonomously carrying out the MBIST test procedure described above. It is programmed via an interface that is not shown in FIG. 1 either by the processor 4 or a test control processor not shown in the diagram. It also contains address, data, array (logical memory to test), status and control registers. It has an input signal that triggers it to start a test burst. In response to this signal it performs the MBIST entry sequence, the memory read and write transactions that make up a burst and then the MBIST exit sequence. At the end of a burst it updates the address register ready for the next burst. When all locations in a logical memory have been tested it sets a test end status bit in a register and asserts a test end signal that may be used interrupt the processor 4 or a test control processor not shown in the diagram. If a memory fault is detected during a burst it sets a memory fault status bit in a register and asserts a memory fault signal that may be used interrupt the processor 4 or a test control processor. A processor can read the status and address registers to determine which memory location is faulty. The MBIST controller 30 runs at the same clock frequency as the processor 4 and is able to carry out back to back MBIST transactions.

The MBIST interface unit 24 routes request, acknowledge and logical memory select signals and memory transactions between the MBIST interface 24 and a memory controller 17, 18 or 19, based on the array signal that is part of the interface 24.

In response to an MBIST request from the MBIST controller 30, which occurs during the MBIST entry phase, indicating that a test procedure is to be performed on a logical memory selected by the array bus, all memories that are part of the same memory type 7-10 that the selected logical memory is part of are reserved (locked) by the associated memory controller 17-19. The memory is locked when all inflight memory transactions are completed before the acknowledgment is returned back to the MBIST controller 30. The locked memories cannot service memory transactions from the processor core 5 until the lock is removed, which occurs during the MBIST exit phase. Meanwhile, transactions can still be processed by the unreserved memories 7-10 while the test procedure is carried out, so that the performance impact on the processor is reduced. Also, the MBIST interface protocol, test procedure and MBIST logic within the processor 4 are designed to ensure that the time that a lock is active is kept as short as possible.

Figure 2:
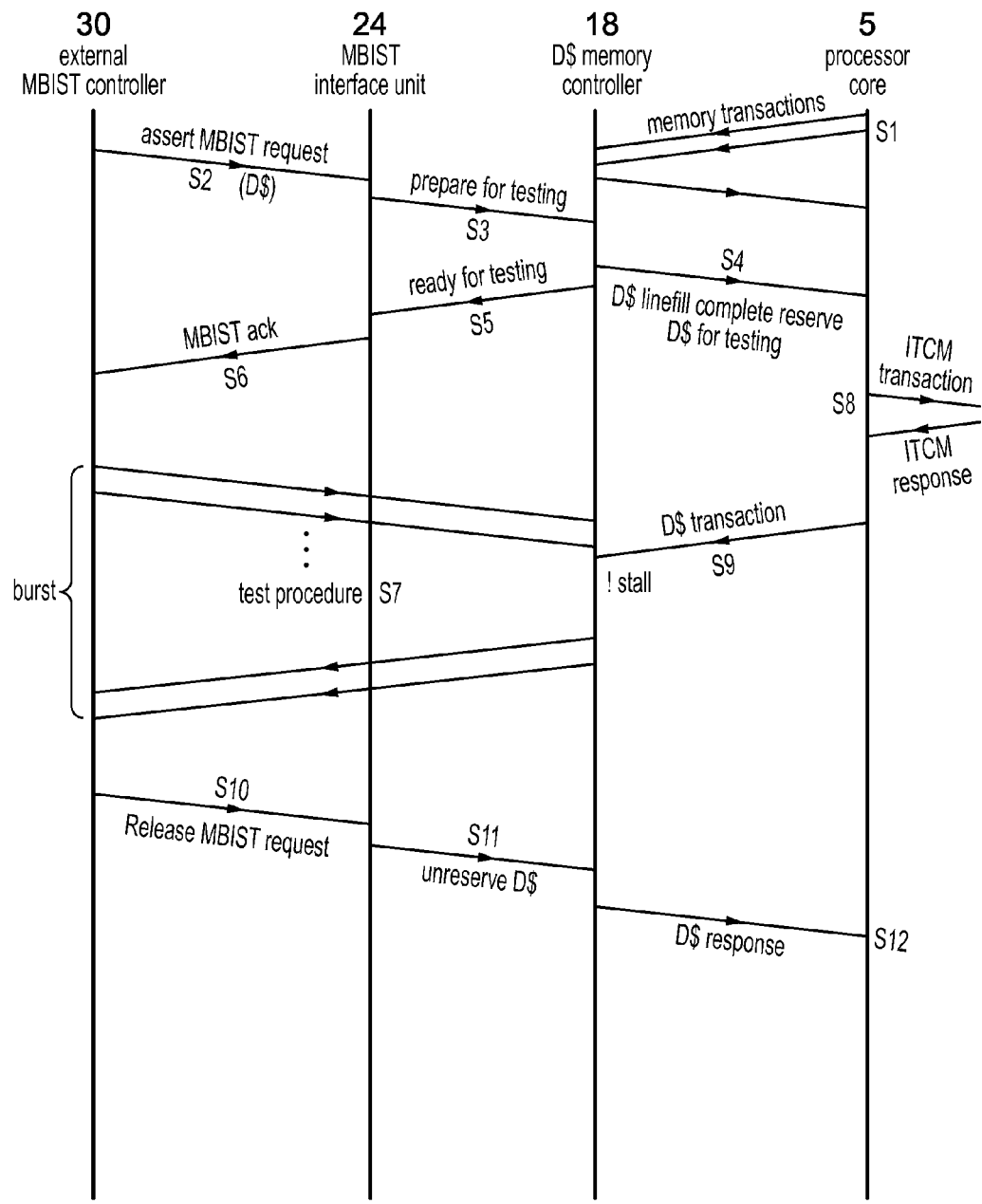
FIG. 2 shows an example of a performing an MBIST test procedure.

FIG. 2 shows a process for performing a MBIST test procedure for testing one or more target memory locations within one of the memories 7-10. FIG. 2 shows the interaction between the MBIST controller 30, the MBIST interface unit 24, a memory controller 18, and the processor core 5. The memory controller 18 for the data cache 8 is shown in this example, but the same operations may apply for the other types of memory.

At step S1, the processor issues a number of memory transactions to the cache 8 and the memory controller 18 controls the cache 8 to respond accordingly. At step S2, the MBIST controller 30 enters the MBIST interface protocol entry phase. This sets the array bus to a value that selects a logical memory within cache memory 8 and asserts the MBIST request signal on the MBIST interface 22. The array bus is decoded by the MBIST interface unit 24 which routes the request to the data cache memory controller 18. For example the MBIST request may be triggered periodically by the MBIST controller in response to a certain testing schedule (e.g. triggered by a test timer elapsing), or the MBIST request may be triggered by a processing error found during processing by the core 5 (e.g. error correcting codes may be used to detect errors).

At step S3 the relevant memory controller 18 for the logical memory 8 selected for testing prepares itself for testing and reserves the memory so that it cannot service any new transactions from the processor core 5. Once reserved then the memory controller 18 will stall any further transactions from the processor core 5 until the test procedure is complete. At step S4, if there is an outstanding memory transaction with the core 5, the L2 cache 14 or the main memory 16, the memory controller 18 waits until these transactions are complete. For example, a transaction which triggered a cache linefill from the L2 cache 14 will be allowed to complete and the line written into the cache memory 8.

Once the memory 8 is ready for testing, at step S5 the memory controller 18 signals to the MBIST interface unit 24 that its memory ready for testing, and then at step S6 the MBIST interface unit 24 issues an MBIST acknowledgment over the interface 22 to the MBIST controller 30. This informs the MBIST controller 30 that the processor is now ready for testing, which ends the MBIST entry phase. The MBIST controller 30 then starts the test procedure at step S7. The test procedure consists of a short burst of MBIST transactions for the target location(s) to probe whether they are functioning correctly. The test procedure will be described in more detail below.

While the test procedure is being performed, the processor core 5 can continue to issue memory transactions. Memory transactions which access a memory type which has not been reserved for testing can still be serviced. For example, at step S8 the processor core 5 issues a transaction to the ITCM 9, and the TCM control unit 19 may control the ITCM to respond in the normal way. However, if at step S9 the processor core 5 attempts to issue a memory transaction to a memory 8 which has been reserved for testing, then the transaction is stalled by the corresponding memory controller 18.

When the test procedure is complete, then at step S10 the MBIST controller 30 starts the MBIST interface protocol exit phase by releasing the MBIST request signal. This is detected by the MBIST interface unit 24 which at step S11 instructs the memory controller 18 for the target memory to unreserve the memory so that it becomes available for use by the processor core 5 again. Hence, at step S12, if the processor core 5 is stalled by a software initiated transaction to memory 8 then this will proceed as normal and the processor will stop being stalled by the MBIST reservation. The MBIST controller 30 waits for any outstanding MBIST read transactions be returned from the processor 4, which ends the MBIST exit phase.

In other examples, the MBIST interface unit 24 may take a more minor role and may simply route information between the MBIST interface 22 and memory controller 17-19. In this case, the MBIST request and MBIST acknowledgement may be exchanged directly between the MBIST controller 30 and memory controller 17-19 via the MBIST interface 22 and MBIST interface 24.

More particularly, at steps S3-S6, the following steps may be performed in some embodiments: a) If there is an outstanding transaction between the data cache memory controller and the core, then this is completed; b) The memory reservation (lock) is applied which prevents any further transactions from the core being started by the data cache memory controller; c) If there is an outstanding transaction between the data cache memory controller and the L2 cache or main memory, then this is completed; and d) The acknowledge signal is then sent back to the MBIST interface unit.

The test procedure at step S7 may be a very short burst of transactions (e.g. lasting for less than 20 processing cycles) which test a few memory locations in a given logical memory at a time before releasing the memory for use by the processor core 5. The next burst tests different locations to the previous burst. Hence, over time all locations in a memory are tested. Since the time between bursts may be large compared to the length of each burst, each burst is very short, the processors can access memories that are not reserved without penalty and bursts are performed without software involvement, this makes the impact of the memory testing on the processor's performance almost negligible. Each short test burst can occur on a regular basis, for example triggered by a counter expiring.

An example of the burst of transactions carried out during the test procedure at step S7 is shown below. The burst can be repeated (with a separate MBIST request for each burst) over multiple values of n for a given range of memory locations to test the entire range of memory. Each burst targets a pair of memory locations specified by an address n and a second address n+m which is offset from the address of the first location by an amount m. The value of m is chosen that a different unit within in a physical memory accessed by the second transaction of a pair so that the locations are in general in different parts of the memory, which is useful for stressing the memory more thoroughly during the test. In the following transactions, "X" represents the value in register X read from location n, "~X" represents a value corresponding to inverting the value in register X, and "Y" represents the value in register Y read from location n+m.

| Operation | Comment |
| --- | --- |
| 1 Read location n and store in reg X | Save location n |
| 2 Read location n + m and store in reg Y | Save location n + m and activate next word line |
| 3 Write X to location n + m | |
| 4 Write ~X to location n | Switch word lines and all bit lines |
| 5 Read location n and check it is equal to ~X | Verifies that no bit is stuck in location n |
| 6 Read location n + m and check that it is equal to X | Switch word lines and all bit lines |
| 7 Write X to location n | Restore location n |
| 8 Write Y to location n + m | Restore location n + m |
| 9 Read location n and check that it is equal to X | Check that X was restored correctly |
| 10 Read location n + m and check that it is equal to Y | Check that Y was restored correctly |

This algorithm is a transparent MBIST test procedure, since at the end of the test procedure the values in locations n and n+m are the same as at the start of the procedure, so that the processor core 5 does not need to save/restore data in software prior to enabling the test procedure. Following the last write transaction at step 8 of the burst, the reserved memory can be unreserved since the subsequent reads at steps 9 and 10 do not affect the validity of the data, so memory transactions from the processor core 5 to the reserved area of memory can start to be served in parallel with steps 9 and 10.

Since the test algorithm may be handled "at speed" by the memory controller in a similar way to regular memory transactions, this test procedure provides thorough testing of the behaviour of the memory when servicing normal memory transactions, which is not possible with other testing methods which are slower because they use an alternate route into the memory which is not used for normal memory transactions. Steps 1 and 2 may be performed back to back and steps 3-10 may be performed back to back. The algorithm has been designed such that, in practise, there are no dependencies between the operations after step 3. For some memories the access latency may mean that there is a gap of a few cycles between steps 2 and 3. The MBIST interface protocol allows transactions to commence before previous read transactions have returned their read data. Hence, the protocol allows any number of outstanding transactions to occur at once (up to the number of outstanding transactions that can be tracked by the MBIST controller).

In steps 1 and 2 above, the values read from locations n and n+m are stored to registers X, Y. These registers may be some of the processor's registers 6. Alternatively, some registers may be provided within the memory controller 17-19 of the memory being tested so that the latency associated with storing the values to the registers and reading the values back from the registers can be reduced, to reduce the overall length of time associated with the test procedure.

If one of the checks at steps 5, 6, 9 or 10 of the test procedure finds that the value read from a location does not match its expected value, then an error is flagged by the MBIST controller 30. If an error is detected, there may be various ways of responding to the error. For example, faulty memory locations may be set as unusable in a memory controller 17-19. Some systems may have some redundancy so that some spare blocks of memory are provided. When an error occurs, a spare block can then be used instead of the faulty block. Also, physical memory macros may contain repair features that allow rows or columns containing faulty storage locations to be disabled and replaced by redundant rows or columns of storage locations. Also, some systems may have a limp home mode in which the functionality of the processor core 5 is reduced if an error is detected. For example, if the L1 data cache 8 fails then it may be disabled and all processing may then be carried out using the L2 cache 14, which while not ideal as the L2 cache 14 will have much longer latency, may still allow the processor core 5 to provide some functionality. In some cases, if sufficient faults are detected, the MBIST controller 30 may generate a signal which causes a warning to be presented to the user indicating that the entire chip 2 should be replaced. For example, a warning light on the dashboard of a car may be displayed. Hence there are a range of ways of responding to detected errors.

Although the MBIST interface unit 24 and memory controllers 17-19 are shown as separate in FIG. 1, in some cases the functionality of the MBIST interface unit 24 may be performed by the memory controllers 17-19 themselves. Also, in some embodiments the MBIST interface unit 24 may be responsible for locking the memory locations being tested, instead of the memory controllers. Hence, in general the apparatus 2 may have some control circuitry implemented in hardware which reserves an area of memory which includes at least one location being tested by the MBIST controller 30.

In the example given above, the entire memory type which includes the test target location(s) is reserved during the test procedure so that it cannot service memory transactions from the processor. However, it is also possible to lock and unlock smaller regions within a given memory type so that other regions within the same memory type can still be accessed by the core 5. For example, individual logical memories, RAM units, banks, rows, or other sub-units of memory locations may be locked individually by the MBIST interface unit 24 or memory controller 17-19, or memory locations may be locked individually.

The functionality of the MBIST interface 22, MBIST interface unit 24 and memory controllers 17-19 used for online MBIST may also be used during manufacture to perform production MBIST. This avoids the need for two separate MBIST interfaces. However, it may be that the test procedure for the production MBIST is different to the test procedure online MBIST. Hence, different MBIST controllers 30 could be provided for the different types of MBIST. In some cases, the MBIST controller may be some processing logic within the chip 2 for performing memory testing. Alternatively (especially for production MBIST), the MBIST controller 30 may be a general purpose computer or other external device which is off-chip and which may be coupled to the MBIST interface 22 for testing.

In the example shown in FIG. 1, only the memory controllers 17-19 which are close to the respective memories 7-10 are reused for conveying the MBIST test transactions to the memories. Hence, the regular memory access pipelines in the processor core 5 are free to execute instructions and access other memories normally. Also, the MBIST transactions are applied before the final pipeline stage in the memory interfaces in the memory controllers 17-19. This means that there is little or no effect on the functional interface timing due to the provision of memory testing and that the functional memory interface logic is also tested during MBIST testing.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. A data processing apparatus comprising:
at least one memory configured to store data;
processing circuitry configured to issue memory transactions for accessing data in the at least one memory;
a memory built-in self-test (MBIST) interface configured to receive a MBIST request indicating that a test procedure is to be performed for testing at least one target memory location of the at least one memory; and
control circuitry configured to detect the MBIST request received by the MBIST interface, and in response to detecting the MBIST request, to reserve for testing at least one reserved memory location including said at least one target memory location;
wherein during the test procedure, the at least one memory is configured to continue servicing memory transactions issued by the processing circuitry which target a memory location other than the at least one reserved memory location reserved by the control circuitry; and
wherein the MBIST interface is configured to receive a plurality of MBIST requests, each MBIST request corresponding to a burst of test transactions for testing a different subset of memory locations of said at least one memory.

2. The data processing apparatus according to claim 1, wherein the control circuitry is configured to prevent servicing of memory transactions from the processing circuitry which target one of said at least one reserved memory location.

3. The data processing apparatus according to claim 1, comprising a plurality of types of memories.

4. The data processing apparatus according to claim 3, wherein the plurality of types of memories comprise two or more of:
a data cache;
an instruction cache;
a data tightly coupled memory; and
an instruction tightly coupled memory.

5. The data processing apparatus according to claim 3, wherein said at least one reserved memory location comprises the memory locations within the same type of memory as said at least one target memory location.

6. The data processing apparatus according to claim 1, wherein said at least one reserved memory location comprises the memory locations within a same sub-unit of memory as said at least one target memory location.

7. The data processing apparatus according to claim 1, wherein the control circuitry is configured to reserve said at least one reserved memory location for testing without intervention of software executed by the processing circuitry.

8. The data processing apparatus according to claim 1, wherein following completion of at least part of the test procedure, the control circuitry is configured to unreserve said at least one reserved memory location to make the at least one reserved memory location available for servicing memory transactions issued by the processing circuitry.

9. The data processing apparatus according to claim 1, wherein the test procedure for testing said at least one target memory location is non-interruptible.

10. The data processing apparatus according to claim 1, wherein in response to detecting the MBIST request, the control circuitry is configured to issue an MBIST acknowledgement signal over the MBIST interface to trigger an MBIST controller coupled to the MBIST interface to start the test procedure.

11. The data processing apparatus according to claim 10, wherein the control circuitry is configured to delay issuing the MBIST acknowledgement signal until the data processing apparatus is ready for performing the test procedure.

12. The data processing apparatus according to claim 1, wherein in the test procedure, the MBIST interface is configured to receive at least one test transaction for testing said at least one target memory location.

13. The data processing apparatus according to claim 12, comprising memory control circuitry configured to route memory transactions issued by the processing circuitry to the at least one memory;
wherein at least part of the memory control circuitry is reused for routing said at least one test transaction received by the MBIST interface to the at least one memory.

14. The data processing apparatus according to claim 1, wherein the test procedure is a transparent test procedure in which, if no error is detected by the test procedure, a data value stored in the at least one target memory location at the end of the test procedure is the same as a data value stored in the at least one target memory location at the beginning of the test procedure.

15. A data processing apparatus comprising:
at least one memory configured to store data;
processing circuitry configured to issue memory transactions for accessing data in the at least one memory;
a memory built-in self-test (MBIST) interface configured to receive a MBIST request indicating that a test procedure is to be performed for testing at least one target memory location of the at least one memory; and
control circuitry configured to detect the MBIST request received by the MBIST interface, and in response to detecting the MBIST request, to reserve for testing at least one reserved memory location including said at least one target memory location;
wherein during the test procedure, the at least one memory is configured to continue servicing memory transactions issued by the processing circuitry which target a memory location other than the at least one reserved memory location reserved by the control circuitry;
wherein said at least one target memory location comprises a pair of memory locations in different parts of the at least one memory, and the test procedure comprises:
(a) reading first and second data values from the pair of memory locations and saving the first and second data values to first and second storage locations;
(b) writing selected data values to the pair of memory locations;
(c) checking whether data values read from the pair of memory locations match the selected data values written to the pair of memory locations;
(d) writing the first and second data values from the first and second storage locations to the pair of memory locations; and
(e) checking whether data values read from the pair of memory locations match the first and second data values stored in the first and second storage locations.

16. The data processing apparatus according to claim 15, wherein the control circuitry is configured to unreserve the at least one reserved memory location after the first and second data values have been written to the pair of memory locations.

17. A memory built-in self-test (MBIST) method for a data processing apparatus comprising at least one memory and processing circuitry configured to issue memory transactions for accessing data in the at least one memory;
the method comprising:
detecting a memory built-in self-test (MBIST) request received by a MBIST interface of the data processing apparatus, the MBIST request indicating that a test procedure is to be performed for testing at least one target memory location of the at least one memory;
in response to detecting the MBIST request, reserving for testing at least one reserved memory location including the at least one target memory location; and
during the test procedure, the at least one memory servicing memory transactions issued by the processing circuitry which target a memory location other than the at least one reserved memory location;
wherein the data processing apparatus comprises control circuitry which detects the MBIST request and reserves the at least one reserved memory location in response to detecting the MBIST request; and
wherein the MBIST interface receives a plurality of MBIST requests, each MBIST request corresponding to a burst of test transactions for testing a different subset of memory locations of said at least one memory.

* * * * *